(12) United States Patent
Wylezinski

(10) Patent No.: US 12,017,435 B2
(45) Date of Patent: Jun. 25, 2024

(54) COMPOSITE STRUCTURES WITH EMBEDDED ELECTRICAL GRIDS

(71) Applicant: Wabash National, L.P., Lafayette, IN (US)

(72) Inventor: Andrzej Wylezinski, Lafayette, IN (US)

(73) Assignee: Wabash National, L.P., Lafayette, IN (US)

( * ) Notice: Subject to any disclaimer, the term of this patent is extended or adjusted under 35 U.S.C. 154(b) by 0 days.

(21) Appl. No.: 18/099,068

(22) Filed: Jan. 19, 2023

(65) Prior Publication Data

US 2023/0150251 A1    May 18, 2023

Related U.S. Application Data

(63) Continuation of application No. 17/177,757, filed on Feb. 17, 2021, now Pat. No. 11,577,498.

(Continued)

(51) Int. Cl.
| | |
|---|---|
| *B32B 27/12* | (2006.01) |
| *B29C 35/02* | (2006.01) |
| *B29C 41/00* | (2006.01) |
| *B32B 27/40* | (2006.01) |
| *B65D 90/02* | (2019.01) |
| *B65D 90/48* | (2006.01) |
| *G01N 27/20* | (2006.01) |
| *H02H 5/10* | (2006.01) |
| *B32B 5/06* | (2006.01) |
| *B32B 5/12* | (2006.01) |
| *B32B 5/22* | (2006.01) |
| *B32B 5/24* | (2006.01) |

(Continued)

(52) U.S. Cl.
CPC ............. *B32B 27/40* (2013.01); *B29C 35/02* (2013.01); *B29C 41/003* (2013.01); *B65D 90/022* (2013.01); *B65D 90/48* (2013.01); *G01N 27/205* (2013.01); *H02H 5/10* (2013.01); *B32B 5/073* (2021.05); *B32B 5/12* (2013.01); *B32B 5/22* (2013.01); *B32B 5/245* (2013.01); *B32B 5/26* (2013.01); *B32B 7/025* (2019.01); *B32B 2260/021* (2013.01); *B32B 2262/106* (2013.01); *B32B 2307/20* (2013.01); *B32B 2457/00* (2013.01); *B65D 90/50* (2013.01); *H01H 2203/028* (2013.01); *H01L 2924/06* (2013.01)

(58) Field of Classification Search
CPC ...................................... B32B 27/12
See application file for complete search history.

(56) References Cited

U.S. PATENT DOCUMENTS

2011/0174211 A1\* 7/2011 Shkolnikov ............ B23K 31/02
114/65 R
2011/0254189 A1  10/2011 Doyle et al.
(Continued)

*Primary Examiner* — Andrew T Piziali
(74) *Attorney, Agent, or Firm* — Faegre Drinker Biddle & Reath LLP

(57) ABSTRACT

A composite structure of a cargo body and a method of making the same are disclosed. The composite structure includes at least one electrical grid embedded within fiber-reinforced polymer (FRP) layers. The embedded electrical grid includes a plurality of conductive fibers and a plurality of insulating fibers integrated into a polymer matrix of the FRP layers. The embedded electrical grid may be used for power distribution, structural strengthening and stiffness, and/or puncture detection.

11 Claims, 8 Drawing Sheets

Related U.S. Application Data

(60) Provisional application No. 62/979,516, filed on Feb. 21, 2020.

(51) Int. Cl.
  *B32B 5/26* (2006.01)
  *B32B 7/025* (2019.01)
  *B65D 90/50* (2019.01)

(56) References Cited

U.S. PATENT DOCUMENTS

| | | |
|---|---|---|
| 2014/0326715 A1 | 11/2014 | Zizzo |
| 2015/0204476 A1* | 7/2015 | Lazzara .................. F16L 9/128 |
| | | 156/178 |
| 2017/0044653 A1 | 2/2017 | Pollitt |
| 2018/0170565 A1 | 6/2018 | Steinwandel et al. |
| 2020/0200696 A1* | 6/2020 | Linde .................... G01M 11/083 |
| 2021/0260858 A1 | 8/2021 | Wylezinski |
| 2022/0055324 A1 | 2/2022 | Hebert |

* cited by examiner

COMPOSITE STRUCTURES WITH EMBEDDED ELECTRICAL GRIDS

CROSS REFERENCE TO RELATED APPLICATIONS

This application is a continuation of prior U.S. application Ser. No. 17/177,757, filed Feb. 17, 2021, which claims priority to U.S. Provisional Patent Application Ser. No. 62/979,516, filed Feb. 21, 2020, the disclosures of which are hereby expressly incorporated by reference herein in their entireties.

FIELD OF THE DISCLOSURE

The present disclosure relates generally to composite structures and methods of making the same. More particularly, the present disclosure relates to composite structures for use in cargo vehicles and other applications having embedded electrical grids and methods of making the same.

BACKGROUND OF THE DISCLOSURE

Cargo vehicles are used in the transportation industry for transporting many different types of cargo. Certain cargo vehicles may be refrigerated and insulated to transport temperature-sensitive cargo. Cargo vehicles may be constructed using composite materials, which may lead to an absence of or reduction in metallic and wood materials and associated advantages, including simplified construction, thermal efficiency, reduced water intrusion and corrosion, and improved fuel efficiency through weight reduction, for example. However, such cargo materials must be sufficiently strong and durable to withstand the demands of normal use, both exteriorly (e.g., weather, road conditions, other vehicles) and interiorly (e.g., cargo, forklifts).

SUMMARY OF THE DISCLOSURE

A composite structure of a cargo body and a method of making the same are disclosed. The composite structure includes at least one electrical grid embedded within fiber-reinforced polymer (FRP) layers. The embedded electrical grid includes a plurality of conductive fibers and a plurality of insulating fibers integrated into a polymer matrix of the FRP layers. The embedded electrical grid may be used for power distribution, structural strengthening and stiffness, and/or puncture detection.

According to an exemplary embodiment of the present disclosure, a laminated composite structure of a cargo body is provided, the composite structure including: a core layer; an outer fiber-reinforced polymer layer coupled to the core layer; an inner fiber-reinforced polymer layer coupled to the core layer; and at least one electrical grid embedded within one or more of the outer and inner fiber-reinforced polymer layers. The at least one electrical grid includes: a plurality of horizontal conductive fibers; a plurality of vertical conductive fibers; a plurality of horizontal insulating fibers that extend between adjacent horizontal conductive fibers; and a plurality of vertical insulating fibers that extend between adjacent vertical conductive fibers.

According to another exemplary embodiment of the present disclosure, a laminated composite structure of a cargo body is provided, the composite structure including: a core layer; an outer fiber-reinforced polymer layer coupled to the core layer; an inner fiber-reinforced polymer layer coupled to the core layer; a first surface; a first electrically conductive element embedded within the composite structure and extending along the first surface; a second surface substantially perpendicular to the first surface; a second electrically conductive element extending along the second surface; a corner electrical connector in electrical communication between the first and second electrically conductive elements.

According to yet another exemplary embodiment of the present disclosure, a cargo body is provided including: a composite panel including at least one electrical grid embedded in a fiber-reinforced polymer; a power source; a control system; an electrical component in communication with the power source; a sensor in communication with the control system. The electrical grid is configured to perform at least one of the following functions: distributing power from the power source to the electrical component; communicating a signal from the sensor to the control system; and detecting a puncture in the composite panel.

Additional features and advantages of the present invention will become apparent to those skilled in the art upon consideration of the following detailed description of the illustrative embodiments exemplifying the best mode of carrying out the invention as presently perceived.

BRIEF DESCRIPTION OF THE DRAWINGS

The foregoing aspects and many of the intended advantages of this invention will become more readily appreciated as the same becomes better understood by reference to the following detailed description when taken in conjunction with the accompanying drawings.

Figure 1:
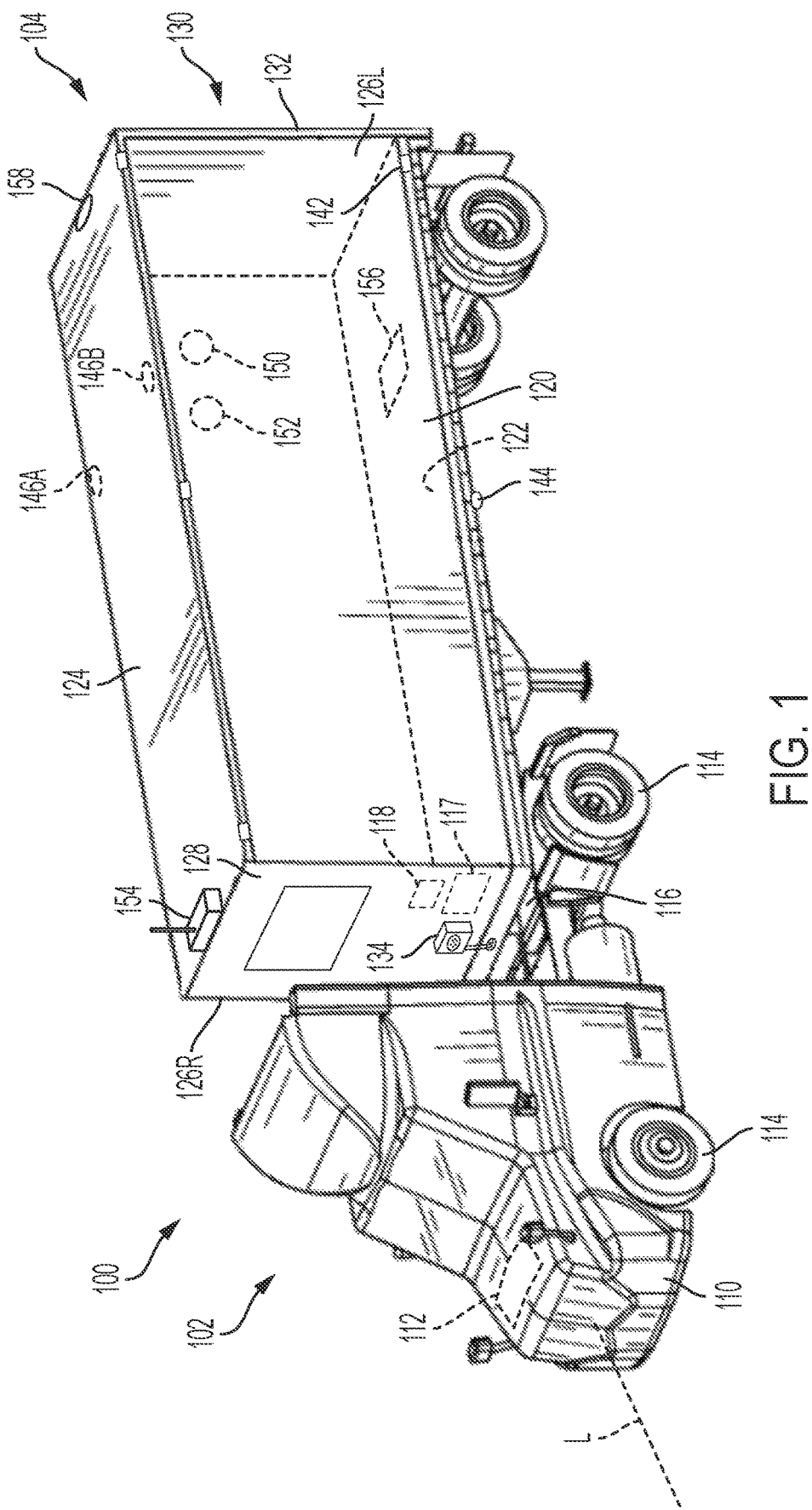
FIG. 1 is a perspective view of a cargo vehicle having a cargo body with a nose, a floor, a roof, and right and left sidewalls.

Corresponding reference characters indicate corresponding parts throughout the several views. Although the drawings represent embodiments of various features and components according to the present disclosure, the drawings are not necessarily to scale and certain features may be exaggerated in order to better illustrate and explain the present disclosure. The exemplification set out herein illustrates an embodiment of the invention, and such an exemplification is not to be construed as limiting the scope of the invention in any manner.

DETAILED DESCRIPTION OF THE DRAWINGS

For the purposes of promoting an understanding of the principals of the invention, reference will now be made to the embodiments illustrated in the drawings, which are described below. The embodiments disclosed below are not intended to be exhaustive or limit the invention to the precise form disclosed in the following detailed description. Rather, the embodiments are chosen and described so that others skilled in the art may utilize their teachings. It will be understood that no limitation of the scope of the invention is thereby intended. The invention includes any alterations and further modifications in the illustrative devices and described methods and further applications of the principles of the invention which would normally occur to one skilled in the art to which the invention relates.

1. Cargo Vehicle

Referring initially to FIG. 1, a cargo vehicle 100 is shown for supporting and transporting cargo. The illustrative vehicle 100 is a tractor-trailer that extends along a longitudinal axis L from a front end 102 to a rear end 104. The vehicle 100 includes a tractor 110 and a cargo body 120, specifically a refrigerated van trailer.

The tractor 110 of the vehicle 100 includes an engine 112, a plurality of wheels 114 powered by the engine 112, and a fifth wheel assembly 116.

The cargo body 120 of the vehicle 100 includes a power source 117 (i.e., a battery) charged by the engine 112 of the tractor 110 or another suitable charging device, a control system 118 in communication with the power source 117, a floor 122 for supporting cargo, a roof 124, right and left sidewalls 126R, 126L, a front wall or nose 128, and a rear door assembly 130 having a rear frame 132 and a door (not shown) to access the cargo body 120. The power source 117 and the control system 118 are shown as being incorporated into the front wall 128 of the cargo body 120 in FIG. 1, although this arrangement may vary. The cargo body 120 includes a king pin assembly (not shown) that couples to the fifth wheel assembly 116 of the tractor 110. The cargo body 120 also includes an electrical connector 134, such as a 7-way plug, that communicates with the tractor 110 when coupled together to charge the power source 117 and/or power electrical components of the cargo body 120.

The cargo body 120 further includes a plurality of electrical components, illustratively upper marker lights 140A, 140B, 140C, a lower marker light 142, a mid-ship turn light 144, and interior dome lights 146A, 146B. Although not shown in FIG. 1, it will be understood that the cargo body 120 may have other electrical components, such as brake lights, reverse lights, license plate lights, batteries, a refrigeration unit, and/or temperature sensors, for example. These electrical components may be powered by the power source 117 of the cargo body 120, as described further in Section 4 below.

The cargo body 120 further includes a plurality of electrical sensors, illustratively a thermocouple 150, a moisture sensor 152, a GPS sensor 154, a load sensor 156 in the floor 122, and an accelerometer 158. These electrical sensors may communicate electrical signals to the control system 118 of the cargo body 120, as described further in Section 4 below.

While the concepts of this disclosure are described in relation to a refrigerated van trailer, it will be understood that they are equally applicable to other cargo bodies generally, and more specifically to other trailers (e.g., dry van trailers, flatbed trailers, commercial trailers, small personal trailers), straight or box truck bodies, and the like. Accordingly, those skilled in the art will appreciate that the present invention may be implemented in a number of different applications and embodiments and is not specifically limited in its application to the particular embodiments depicted herein.

2. Composite Sidewalls and Other Composite Structures

Cargo body 120 may be constructed, at least in part, of composite materials. For example, the floor 122, roof 124, right and left sidewalls 126R, 126L, and/or front wall 128 of the composite cargo body 120 may be constructed of composite materials. As such, the floor 122, roof 124, right and left sidewalls 126R, 126L, and/or front wall 128 of the composite cargo body 120 may be referred to herein as composite structures. Each composite structure may be a single, unitary component, which may be formed from a plurality of layers permanently coupled together. Exemplary composite materials for use in the composite cargo body 120 include fiber-reinforced polymers or plastics (FRPs), for example glass-fiber-reinforced polymers or plastics (GFRPs) and carbon-fiber-reinforced polymers or plastics (CRPs).

Figure 2:
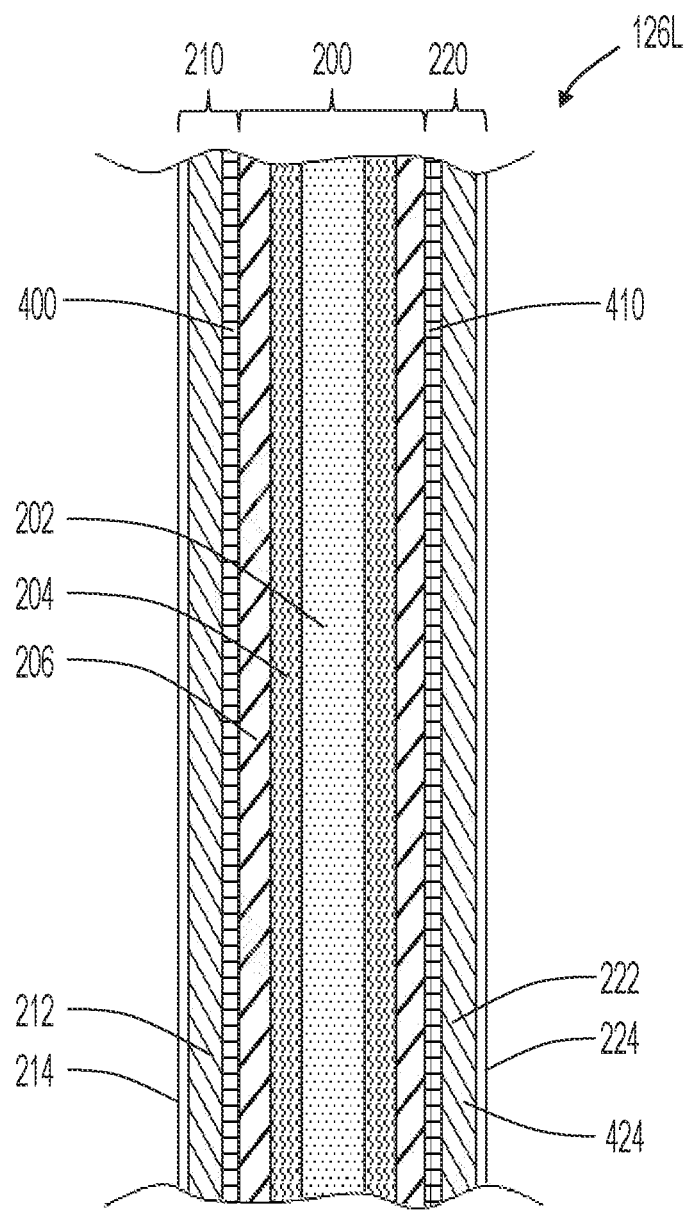
FIG. 2 is a cross-sectional view of the left sidewall of FIG. 1, including an embedded electrical grid.

A laminated composite left sidewall 126L is shown in cross-section in FIG. 2. Those skilled in the art will appreciate that the following teachings related to the left sidewall 126L may also be applied to the floor 122, roof 124, right sidewall 126R, and/or front wall 128 of the composite cargo body 120.

The illustrative sidewall 126L of FIG. 2 includes a core layer 200, an outer skin layer 210 that faces outwardly from the cargo body 120 (FIG. 1) toward the surrounding environment, and an inner skin layer 220 that faces inwardly toward the cargo in cargo body 120 (FIG. 1). Each of these laminated layers 200, 210, 220 is described further below.

Referring still to FIG. 2, the core layer 200 of the composite sidewall 126L may include one or more structural supports or preforms. Exemplary preforms for use in core layer 200 include PRISMA® preforms provided by Compsys, Inc. of Melbourne, Florida Each preform may include an inner foam core 202, an intermediate layer 204, and an outer FRP layer 206, each of which is described further below.

The inner foam core 202 of each preform may include a self-expanding, self-curing structural foam material. Suitable foams include polyurethane foams, such as a methylene-diphenyl-methane diisocyanate (MDI) based rigid polyurethane foam, for example.

The outer FRP layer 206 (which may be referred to herein as the "first" FRP layer 206) of each preform may include a polymer matrix reinforced with fibers configured to enhance the structural properties of the surrounding polymer matrix. Suitable reinforcing fibers include glass fibers, carbon fibers, aramid fibers (e.g., Kevlar® fibers available from DuPont Protection Technologies of Richmond, Virginia), linear polyethylene or polypropylene fibers (e.g., Spectra® fibers available from Honeywell International Inc. of Morris Plains, New Jersey), or polyester fibers. The reinforcing fibers may be present in fabric form, which may be mat, woven, or knit, for example. Exemplary fabrics include chopped fiber fabrics, such as chopped strand mats (CSM), and continuous fiber fabrics, such as 0°/90° fiberglass fabrics, +45°/−45° fiberglass fabrics, +60°/−60° fiberglass fabrics, 0° warp unidirectional fiberglass fabrics, and other stitched fiber fabrics, for example. Exemplary fabrics are commercially available from Vectorply Corporation of Phenix City, Alabama and include the E-LM 1810 fiberglass fabric with 0° unidirectional fibers, the E-LTM 3610 fiberglass fabric with 0°/90° fibers, and the E-LTM 2408 fiberglass fabric with 0°/90° fibers, for example. Such fabrics may have an area density of about 800 g/m$^2$ to about 1,500 g/m$^2$ or more.

The intermediate layer 204 of each preform may serve as a transition layer for coupling the inner foam core 202 to the outer FRP layer 206. The intermediate layer 204 may be sufficiently porous to at least partially receive foam from the adjacent foam core 202 and the polymer matrix from the adjacent FRP layer 206. The intermediate layer 204 may also be mechanically coupled (e.g., stitched) to the adjacent FRP layer 206 to simplify manufacturing, to ensure proper placement, and to prevent shifting and/or bunching. The intermediate layer 204 may be a nonwoven fabric with continuous or chopped fibers.

The individual preforms of the core layer 200 may be designed to accommodate the needs of the particular application. For example, in areas of the final structure requiring more strength and/or insulation, a low-density foam core 202 may be replaced with a high-density foam core 202 or a hard, plastic block. The individual preforms of the core layer 200 may also be sized, shaped, and arranged in a manner that accommodates the needs of the particular application. For example, in areas of the final structure requiring less strength, the preforms may be relatively large in size, with the foam cores 202 spanning relatively large distances before reaching the surrounding layers 204, 206. By contrast, in areas of the final structure requiring more strength, the preforms may be relatively small in size, with the foam cores 202 spanning relatively small distances before reaching the surrounding layers 204, 206. Stated differently, the preforms may be shaped as relatively wide panels in areas of the final structure requiring less strength and as relatively narrow support beams in areas of the final structure requiring more strength.

Referring still to FIG. 2, the outer skin layer 210 of the composite sidewall 126L may include a FRP layer 212 and an outer gel coat 214. The FRP layer 212 (which may be referred to herein as the "second" FRP layer 212) may be similar to the above-described first FRP layer 206, including a polymer matrix reinforced with suitable reinforcing fibers. According to an exemplary embodiment of the present disclosure, a plurality of different reinforcing fiber layers may be stacked together and used in combination to form the FRP layer 212. For example, a chopped fiber fabric (e.g., CSM) may be positioned adjacent to a continuous fiber fabric. In this stacked arrangement, the chopped fibers may help support and maintain the adjacent continuous fibers in place, especially around corners or other transitions. Also, the chopped fibers may serve as a web to resist column-type loads in compression, while the adjacent continuous fibers may resist flange-type loads in compression. Adjacent reinforcing fiber layers may be stitched or otherwise coupled together to simplify manufacturing, to ensure proper placement, and to prevent shifting and/or bunching. The outer gel coat 214 may be a polymer-rich or polymer-only layer that provides a smooth outer finish in a desired color.

Referring still to FIG. 2, the inner skin layer 220 of the composite sidewall 126L may include a FRP layer 222 and an optional inner gel coat 224. The FRP layer 222 (which may be referred to herein as the "third" FRP layer 222) may be similar to the above-described first and second FRP layers 206, 212, including a polymer matrix reinforced with suitable reinforcing fibers. The inner gel coat 224 may be a polymer-rich or polymer-only layer similar to the above-described outer gel coat 214 that provides a smooth inner finish in a desired color.

The illustrative composite sidewall 126L further includes one or more conductive electrical layers 400, 410 embedded within the sidewall 126L. The electrical layers 400, 410 may be referred to herein as the "fourth" and/or "fifth" FRP layers 400, 410. The electrical layers 400, 410 are described further in Section 4 below.

3. Composite Molding Method

The composite structures of the present disclosure, including the composite sidewall 126L of FIG. 2, may be formed by a layered molding process. An exemplary molding process involves (1) applying a gel-coat resin onto a mold surface to form the outer gel coat 214, (2) layering the reinforcing fibers of the outer FRP layer 212, the preforms of the core layer 200, the reinforcing fibers of the inner FRP layer 222, and any other desired layers (e.g., electrical layers 400, 410 of Section 4 below) onto the outer gel coat 214, (3) wetting out the layers 212, 200, 222, and any other applied layers with at least one laminating resin to impregnate and/or coat the fibers, (4) optionally applying another gel-coat resin onto the layers 212, 200, 222 to form the inner gel coat 224, and (5) curing the materials upon the mold surface (either sequentially and/or simultaneously) to form a single, integral, laminated composite sidewall 126L.

The laminating resin of step (3) may be a typical thermosetting resin, such as a vinyl ester, epoxy resin, or unsaturated polyester resin, although thermoplastic resins are also contemplated. The gel-coat resin of steps (1) and (4) may be a typical polyester gel-coat resin or a co-cure resin containing one or more elastomer components, such as urethane, co-cured with one or more laminating resin components, such as a vinyl ester, epoxy resin, or unsaturated polyester components. Exemplary co-cure resins are disclosed in U.S. Pat. No. 9,371,468 and U.S. Publication No. 2016/0263873, the disclosures of which are hereby incorporated by reference in their entireties.

Additional information regarding the construction of composite structures is disclosed in the following patents, each of which is incorporated by reference in its entirety herein: U.S. Pat. Nos. 5,429,066, 5,664,518, 5,800,749, 5,830,308, 5,897,818, 5,908,591, 6,004,492, 6,013,213, 6,206,669, 6,496,190, 6,497,190, 6,543,469, 6,723,273, 6,755,998, 6,869,561, 6,911,252, 8,474,871, 10,239,265.

4. Embedded Electrical Grid

Referring still to FIG. 2, the left composite sidewall 126L includes the first electrical layer 400 and the second electrical layer 410. The first (i.e., outer) electrical layer 400 is embedded within the outer skin layer 210 of the composite sidewall 126L between the core layer 200 and the adjacent outer gel coat 214, and the second (i.e., inner) electrical layer 410 is embedded within the inner skin layer 220 of the composite sidewall 126L between the core layer 200 and the adjacent inner gel coat 224. Although the composite sidewall 126L is shown with both outer and inner electrical layers 400, 410, it is within the scope of the present disclosure for the composite sidewall 126L to have only a single, outer or inner electrical layer.

The inner electrical layer 410 of the left composite sidewall 126L is shown schematically in FIGS. 3-6. Those skilled in the art will appreciate that the following teachings related to the inner electrical layer 410 of the left sidewall 126L may also be applied to the outer electrical layer 400 of the left sidewall 126L and/or electrical layers of the floor 122, roof 124, right sidewall 126R, and/or front wall 128.

The left composite sidewall 126L includes horizontal conductive fibers 420 and vertical conductive fibers 430 arranged perpendicular to each other in a grid pattern to form an electrical grid. The horizontal conductive fibers 420 are electrically insulated from the vertical conductive fibers 430. In the illustrated embodiment of FIGS. 3-6, one or both electrical layers 400, 410 form independent electrical grids on either side of the core layer 200, with one or both electrical layers 400, 410 having horizontal conductive fibers 420 as well as vertical conductive fibers 430. In the illustrated embodiment of FIG. 7, the electrical layers 400, 410 cooperate to form the electrical grid on either side of the core layer 200, with one electrical layer 400 having horizontal conductive fibers 420 and the opposing electrical layer 410 having vertical conductive fibers 430, or vice versa.

Figure 3:
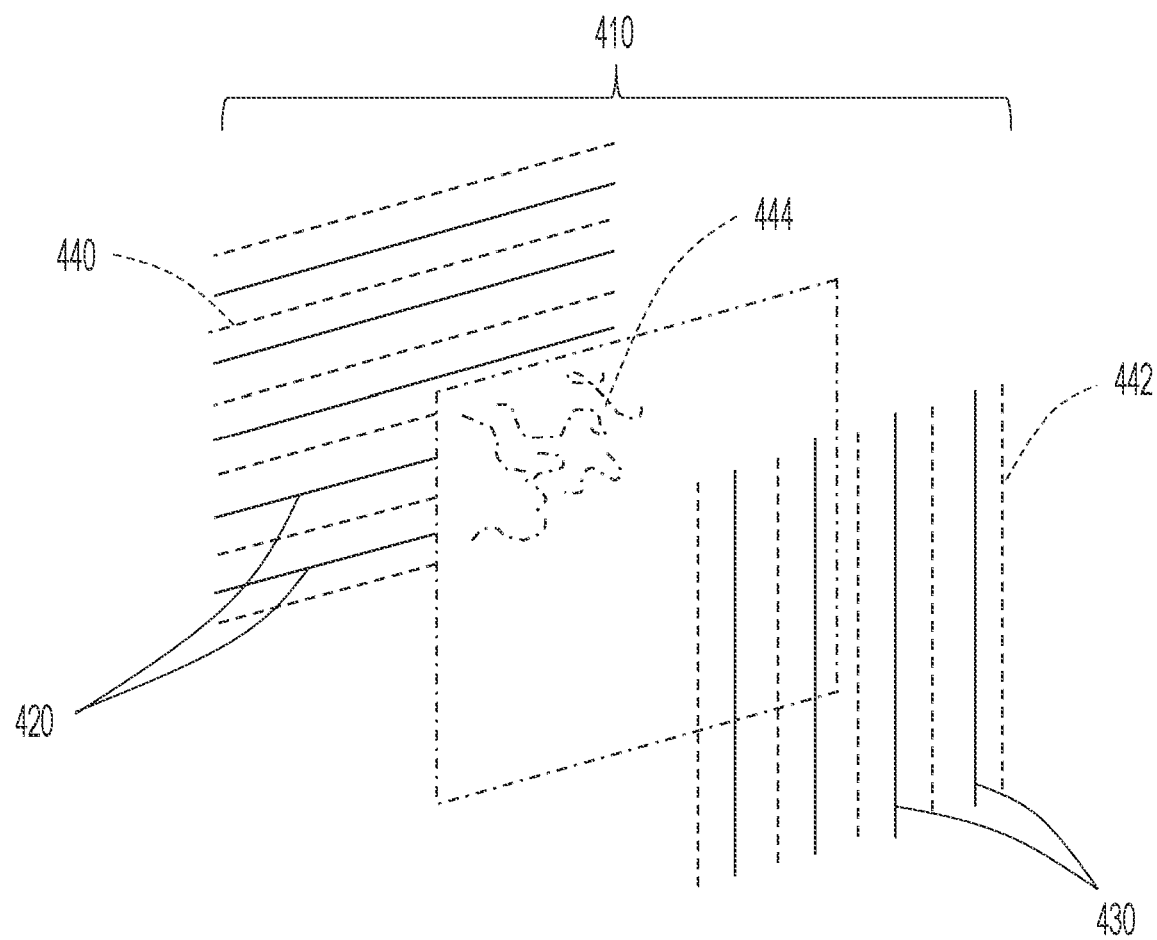
FIG. 3 is an exploded perspective view of the electrical grid of FIG. 2.

As shown in FIG. 3, the electrical layer 410 forms an independent electrical grid (irrespective of the opposing electrical layer 400). The electrical layer 410 illustratively includes a plurality of horizontal and vertical conductive fibers 420, 430, such as carbon fibers, and a plurality of horizontal, vertical, and intermediate insulating fibers 440, 442, 444, such as E-glass fibers, arranged in the grid pattern. The horizontal insulating fibers 440 extend between adjacent horizontal conductive fibers 420, the vertical insulating fibers 442 extend between adjacent vertical conductive fibers 430, and the intermediate insulating fibers 444 are sandwiched between the horizontal conductive fibers 420 on one side and the vertical conductive fibers 430 on the other side. The intermediate insulating fibers 444 may be present in the form of a mat (e.g., CSM), for example.

The illustrative electrical grid of electrical layer 410 may be a non-woven, non-crimped, carbon/glass hybrid fabric. To form this fabric, the horizontal conductive fibers 420 and the horizontal insulating fibers 440 may be stitched into one side of the mat of intermediate insulating fibers 444, and the vertical conductive fibers 430 and the vertical insulating fibers 442 may be stitched into the other side of the mat of intermediate insulating fibers 444. Suitable fabrics for use as the electrical grid of electrical layer 410 are available from SAERTEX USA of Huntersville, North Carolina.

Figure 4:
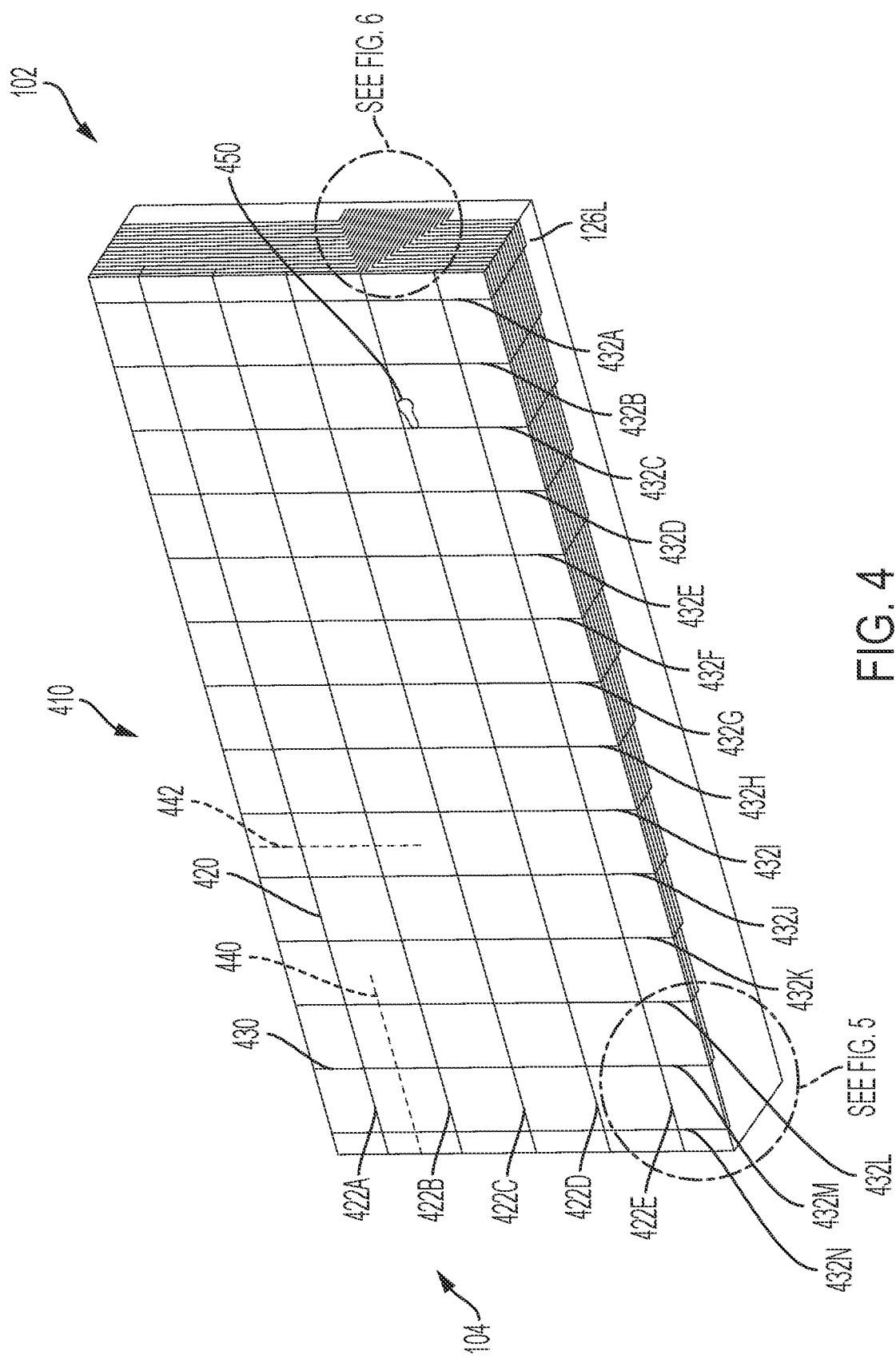
FIG. 4 is a schematic perspective view of the left sidewall of FIG. 1.

Referring next to FIG. 4, the electrical grid of electrical layer 410 is arranged across the composite sidewall 126L with the horizontal conductive fibers 420 extending horizontally across the composite sidewall 126L and the vertical conductive fibers 430 extending vertically across the composite sidewall 126L and perpendicular to the horizontal conductive fibers 420. The horizontal conductive fibers 420 include a plurality of (e.g., five) spaced-apart subsets 422A-E with the horizontal insulating fibers 440 positioned therebetween, and the vertical conductive fibers 430 include a plurality of (e.g., fourteen) spaced-apart subsets 432A-N with the vertical insulating fibers 442 positioned therebetween. In certain embodiments, the horizontal subsets 422A-E and the vertical subsets 432A-N are spaced apart from one another by about 1-10 inches, more specifically about 1-6 inches, more specifically about 1-3 inches. It is understood that the number of horizontal subsets 422A-E and vertical subsets 432A-N and the spacing therebetween may vary. Each subset 422A-E, 432A-N may include one or more filaments, which may be arranged in parallel as shown in FIG. 4 (i.e., a tow) or intertwined (e.g., twisted).

Figure 5:
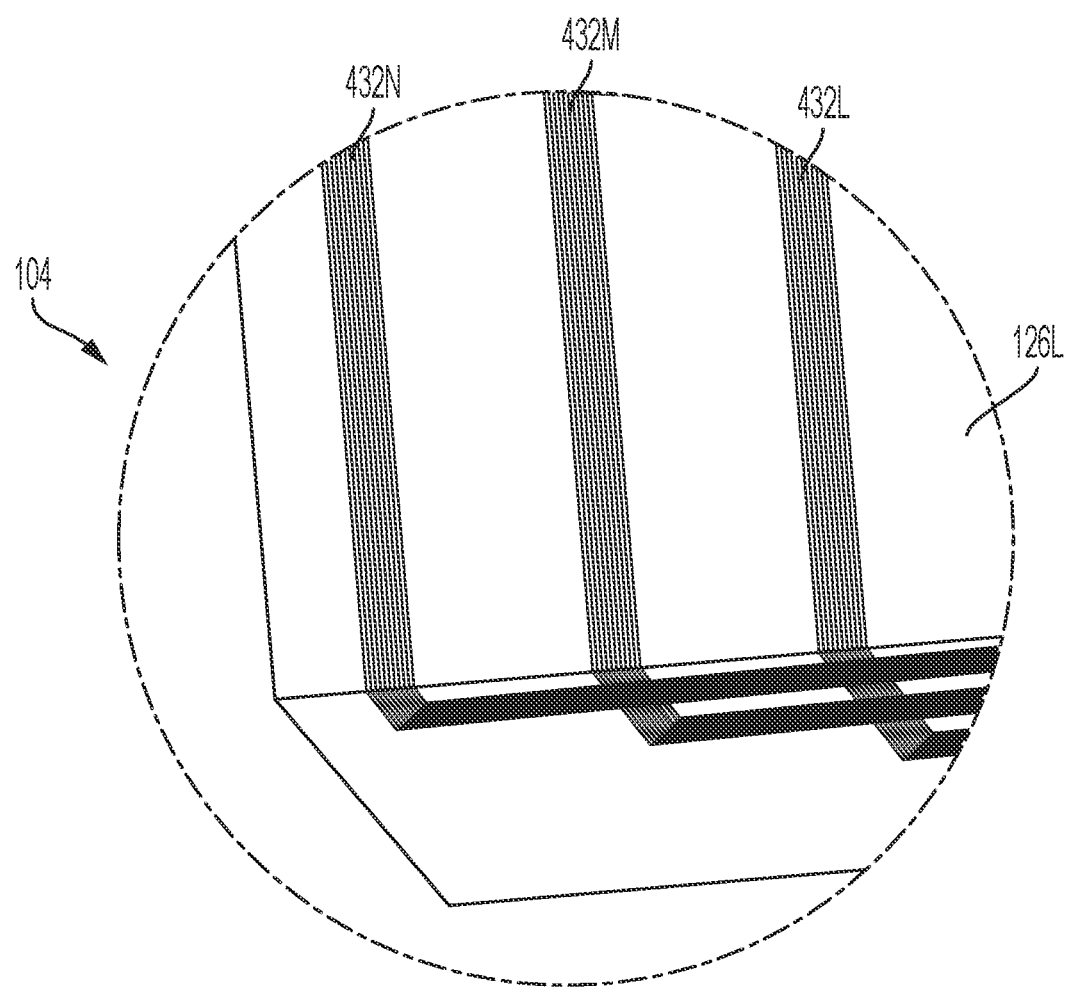
FIG. 5 is a detailed view of a first circled area in FIG. 4.
Figure 6:
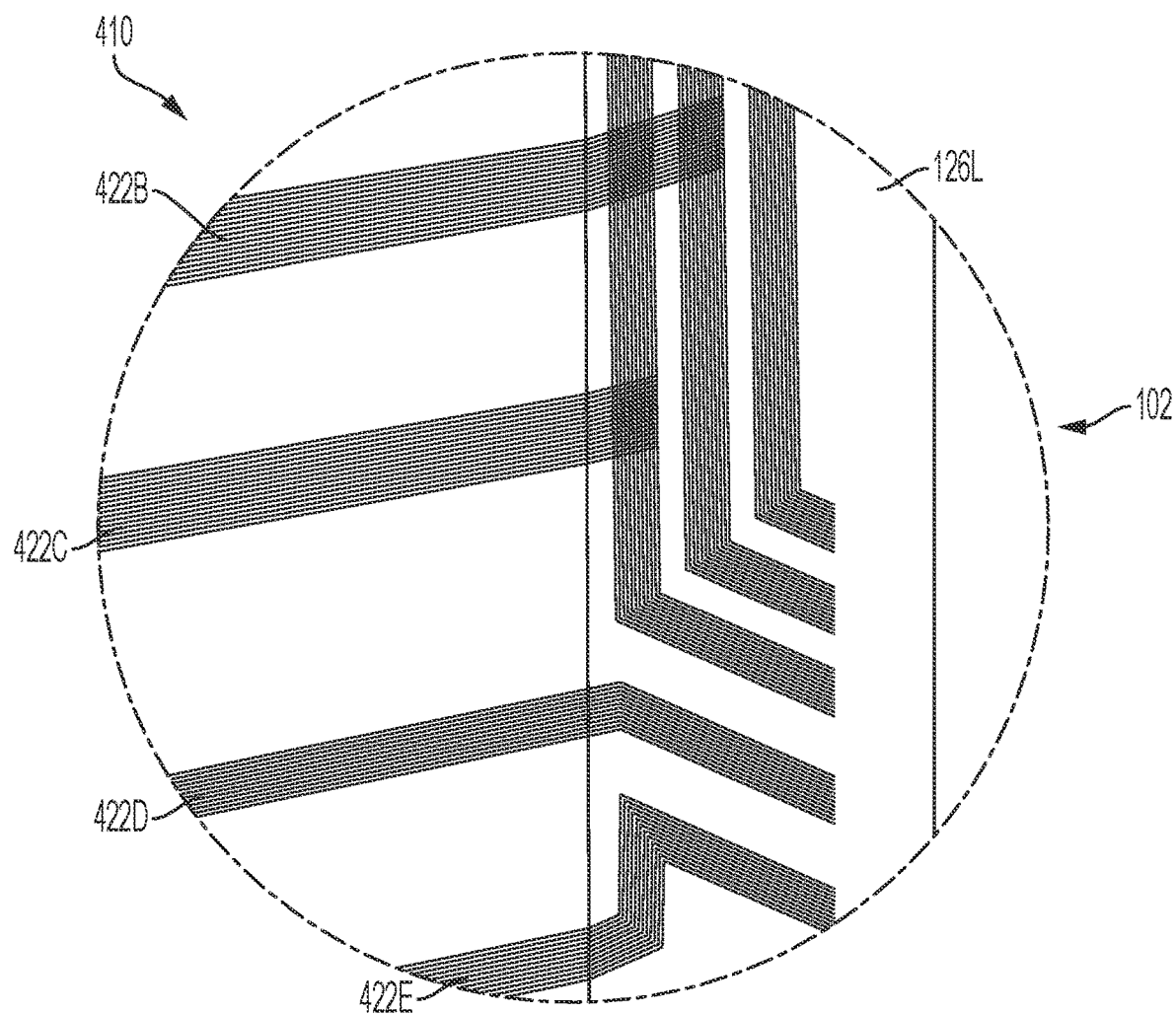
FIG. 6 is a detailed view of a second area circled in FIG. 4.

The conductive fibers 420, 430 may be gathered near the front end 102 of the composite sidewall 126L for communication with the power source 117, control system 118, and/or electrical connector 134 in the front wall 128 (FIG. 1). As shown in FIG. 4, for example, the vertical conductive fibers 430 are directed across the top and/or bottom of the composite sidewall 126L and toward the front end 102 while maintaining insulation therebetween. As shown in FIG. 5, the horizontal conductive fibers 420 are also wrapped and gathered near the front end 102 while maintaining insulation therebetween. Although not shown in FIG. 4, the conductive fibers 420, 430 may wrap across the rear end 104 of the composite sidewall 126L in a similar manner. The conductive fibers 420, 430 may be wrapped in tape or another suitable protective layer, especially at bent or gathered locations.

The electrical grid formed by one or both electrical layers 400, 410 may be embedded within the composite sidewall 126L during the molding process of Section 3 above. During the layering step (2), the electrical grid of one or both electrical layers 400, 410 may be placed in its desired location. During the wetting step (3), the electrical grid of one or both electrical layers 400, 410 may be impregnated and/or coated with resin along with the other FRP layers 212, 222 (FIG. 2). Then, during the curing step (5), the electrical grid of one or both electrical layers 400, 410 may become an integral part of the laminated composite sidewall 126L with the conductive carbon fibers 420, 430, and the insulating fibers 440, 442, 444, embedded within the surrounding polymer matrix. Allowing the polymer matrix to integrate evenly into the electrical grid of one or both electrical layers 400, 410 throughout the composite sidewall 126L may reduce the risk of surface disruptions and/or delamination.

Referring still to FIG. 4, the electrical grid formed by one or both electrical layers 400, 410 may serve one or more functions in the composite sidewall 126L, including (1) power storage and/or distribution, (2) telematics and connectivity, (3) structural strengthening and stiffness, and/or (4) puncture detection. Each of these functions is described further below.

First, the electrical grid of one or both electrical layers 400, 410 may store and/or distribute power throughout the composite sidewall 126L without the need for a traditional, exposed wiring harness. The power source 117 may allow the cargo body 120 to store energy and operate the electrical grid of one or both electrical layers 400, 410 independently, whether or not the cargo body 120 is coupled to the tractor 110. Also, because they are insulated from one another, the horizontal subsets 422A-E and the vertical subsets 432A-N may be powered independently. In the illustrated embodiment of FIG. 4, for example, the horizontal subsets 422A-E are powered in an alternating positive/negative manner (e.g., subset 422A is positive, subset 422B is negative, subset 422C is positive, subset 422D is negative, and subset 422E is positive). Each electrical component of the cargo body 120 (e.g., the upper marker lights 140A, 140B, 140C, the lower marker light 142, the mid-ship turn light 144, and the interior dome lights 146A, 146B (FIG. 1)) may be connected to at least one positive and at least one negative conductive fiber 420, 430 to complete the electrical circuit and power the electrical component. In some embodiments, each electrical component may be coupled to more than one positive and/or negative conductive fiber 420, 430 within the same electrical grid for redundancy. In other embodiments, each electrical component may be coupled to multiple electrical grids for redundancy. In one example, the electrical component may be coupled to multiple electrical grids of electrical layers 400, 410 within the same sidewall 126L (FIG. 2). In another example, the electrical component may be coupled to multiple electrical grids within different composite panels, such as the electrical grid of electrical layer 410 of the sidewall 126L and a similar electrical grid of the opposing sidewall 126R (FIG. 1). In this way, the electrical component may continue to operate despite damage to any single fiber 420, 430 or electrical layer 400, 410.

Second, the electrical grid of one or both electrical layers 400, 410 may communicate electrical signals from one or more sensors to the control system 118 to facilitate telematics and connectivity. For example, the electrical grid of electrical layer 410 may communicate signals indicative of temperature from the thermocouple 150, signals indicative of moisture level from the moisture sensor 152, signals indicative of location from the GPS sensor 154, signals indicative of weight on the floor 122 from the load sensor 156, and/or signals indicative of a collision from the accelerometer 158. The control system 118 may be programmed to process these signals and communicate relevant information to the driver, the owner, or other parties.

Third, the electrical grid of one or both electrical layers 400, 410, in particular the conductive carbon fibers 420, 430, of the electrical grid 410, may provide stiffness and strength to the composite sidewall 126L. The insulating fibers 440, 442, 444, of the electrical grid of one or both electrical layers 400, 410 may also help distribute structural loads throughout the electrical grid and to surrounding FRP layers 212, 222 (FIG. 2) of the composite sidewall 126L.

Fourth, the electrical grid of one or both electrical layers 400, 410 may enable puncture detection. If any of the conductive fibers 420, 430 are damaged or cut in a way that breaks the electrical circuit, the control system 118 may alert the driver, the owner, or other parties of the puncture. According to an exemplary embodiment of the present disclosure, the control system 118 may also be programmed to identify the x-coordinate of the puncture by identifying which vertical subset 432A-N was cut and/or the y-coordinate of the puncture by identifying which horizontal subset 422A-E was cut. In FIG. 4, for example, the control system 118 may identify the x-/y-coordinates of a fork-lift puncture 450 by identifying breaks in vertical subset 432C and horizontal subset 422D. Upon receiving the puncture alert, the responsible parties may inspect the composite sidewall 126L, take steps to prevent additional damage, and make any necessary repairs.

Figure 7:
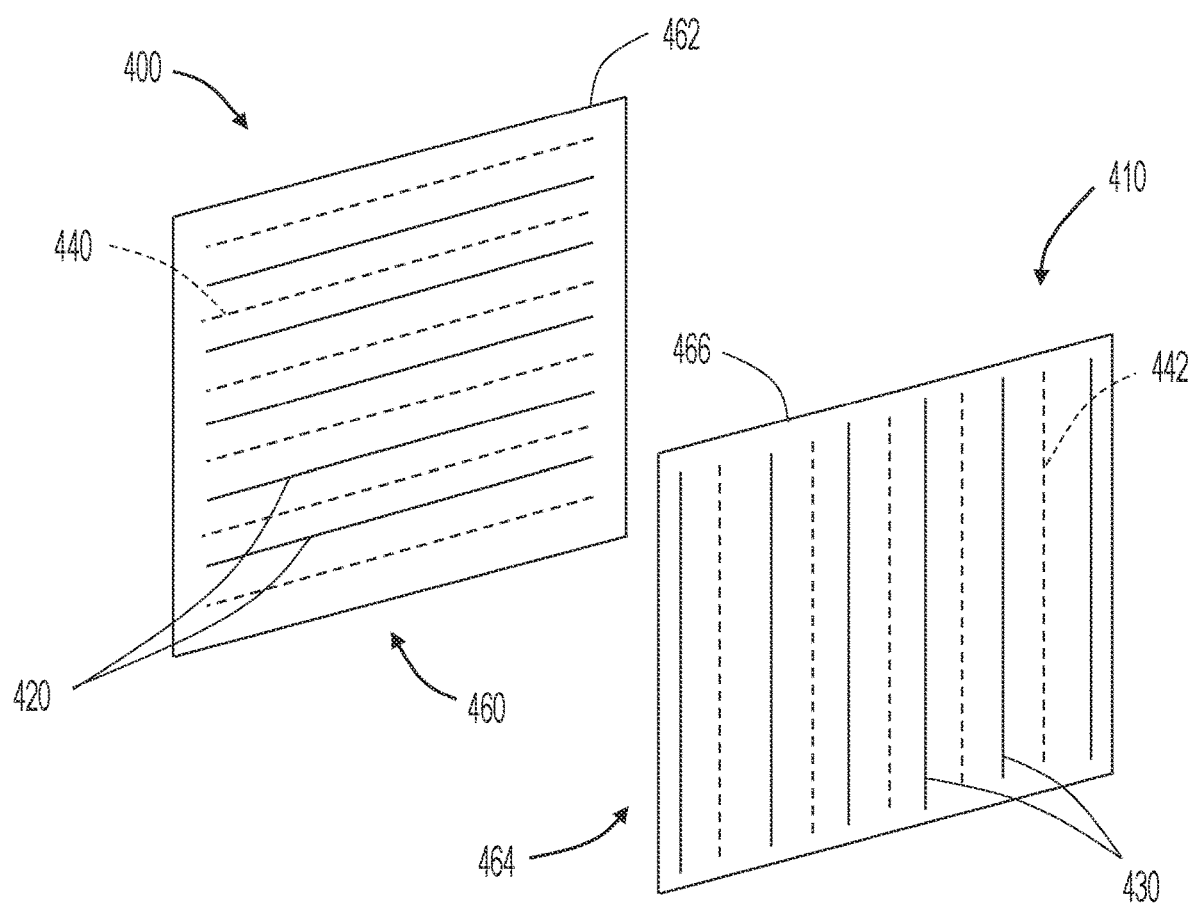
FIG. 7 is an exploded perspective view of another embodiment of the electrical grid.

Referring next to FIG. 7, the electrical layers 400, 410 cooperate to form the electrical grid on either side of the core layer 200 (FIG. 2). Non-woven, non-crimped, carbon/glass hybrid fabrics similar to the fabric shown in FIG. 3 may also be used in this embodiment. However, a first fabric 460 containing the horizontal conductive fibers 420 and the horizontal insulating fibers 440 stitched to a first backing sheet 462 may serve as the first electrical layer 400, and a second fabric 464 containing the vertical conductive fibers 430 and the vertical insulating fibers 442 stitched to a second backing sheet 466 may serve as the second electrical layer 410, or vice versa. The intermediate insulating fibers 444 (FIG. 3) may be replaced by the core layer 200 (FIG. 2) in this embodiment. The first and second fabrics 460, 464 may be identical to one another except for their orientation in the composite sidewall 126L.

5. Corner Electrical Connectors

Figure 8:
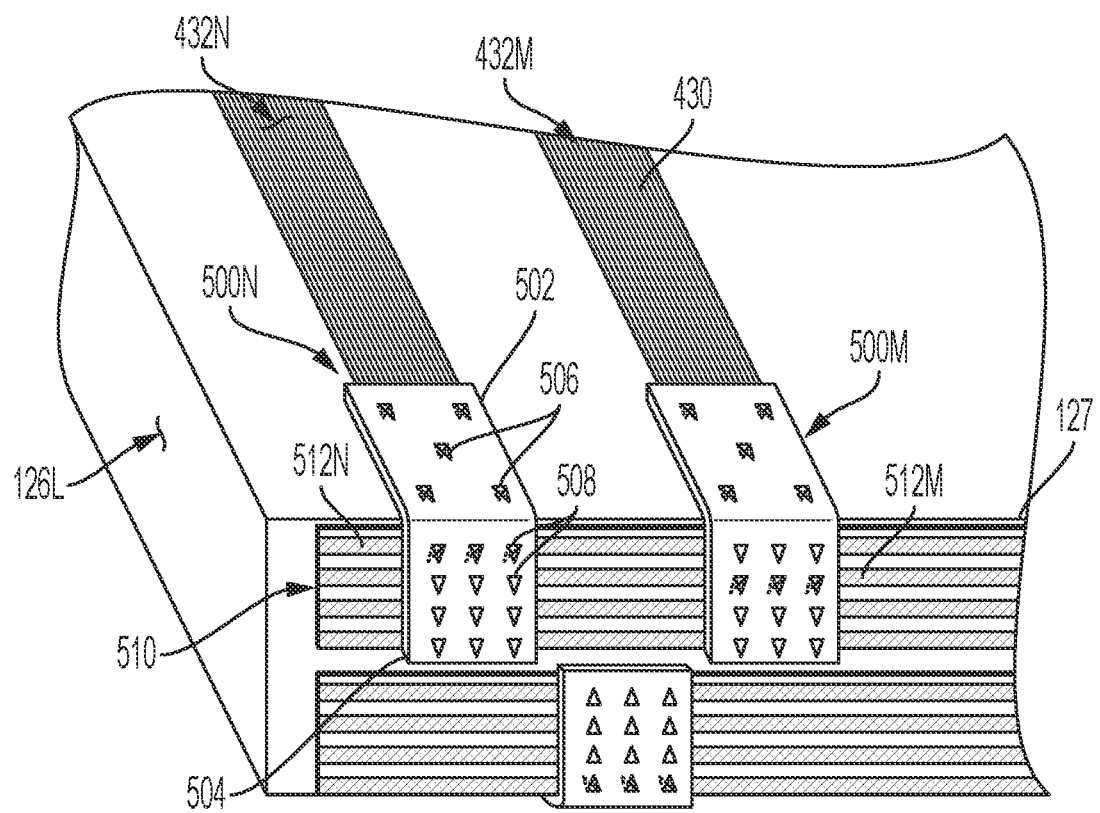
FIG. 8 is a perspective view of a corner electrical connector for use with the electrical grid of FIG. 2.

Referring next to FIG. 8, a plurality of exemplary corner electrical connectors 500M, 500N are shown for connecting the above-described electrical grid to another electrical component (illustratively, a wiring harness 510 adhered to and running across the bottom surface of the composite sidewall 126L) across a corner (illustratively, a bottom corner 127 of the composite sidewall 126L). The corner electrical connectors 500M, 500N may provide safe, reliable, rugged, customizable electrical connections across the bottom corner 127 of the composite sidewall 126L. Although the corner electrical connectors 500M, 500N are illustratively positioned across the bottom corner 127 of the composite sidewall 126L in FIG. 8, similar corner electrical connectors may be positioned across other corners of the cargo body 120 (FIG. 1), including upper corners, front corners, and/or rear corners of the cargo body 120.

The corner electrical connectors 500M, 500N may be constructed of metal (e.g., copper) or another suitable conductive material. The illustrative corner electrical connectors 500M, 500N of FIG. 8 are L-shaped components, each having a first plate 502 and a second plate 504 arranged at a 90-degree angle, but this shape may vary. The first plate 502 includes a plurality of selectively moveable first prongs 506, and the second plate 504 includes a plurality of selectively moveable second prongs 508. If necessary, these prongs 506, 508 may puncture and extend through certain layers of the composite sidewall 126L to reach embedded electrical components. The corner electrical connectors 500M, 500N may be adhered to, embedded within, or otherwise coupled to the composite sidewall 126L.

With respect to the corner electrical connector 500M of FIG. 8, the first plate 502 is positioned adjacent to the subset 432M of vertical conductive fibers 430, and the second plate 504 is positioned adjacent to the wiring harness 510. All of the first prongs 506 have been pressed downward to contact the subset 432M of vertical conductive fibers 430. A second row of the second prongs 508 has been pressed downward to contact a corresponding wire 512M of the wiring harness 510, while other second prongs 508 remain raised to avoid contacting other wires of the wiring harness 510. In this arrangement, the corner electrical connector 500M places the subset 432M of vertical conductive fibers 430 in electrical communication with the corresponding wire 512M of the wiring harness 510 across the bottom corner 127 of the composite sidewall 126L.

With respect to the corner electrical connector 500N of FIG. 8, the first plate 502 is positioned adjacent to the subset 432N of vertical conductive fibers 430, and the second plate 504 is positioned adjacent to the wiring harness 510. All of the first prongs 506 have been pressed downward to contact the subset 432N of vertical conductive fibers 430. A first row of the second prongs 508 has been pressed downward to contact a corresponding wire 512N of the wiring harness 510, while other second prongs 508 remain raised to avoid contacting other wires of the wiring harness 510. In this arrangement, the corner electrical connector 500N places the subset 432N of vertical conductive fibers 430 in electrical communication with the corresponding wire 512N of the wiring harness 510 across the bottom corner 127 of the composite sidewall 126L.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practices in the art to which this invention pertains.

What is claimed is:

1. A laminated composite structure of a cargo body, the composite structure comprising:
   a core layer;
   an outer fiber-reinforced polymer layer coupled to the core layer;
   an inner fiber-reinforced polymer layer coupled to the core layer; and
   at least one electrical grid embedded within one or more of the outer and inner fiber-reinforced polymer layers, wherein the at least one electrical grid includes:
   a first plurality of conductive fibers;
   a second plurality of conductive fibers perpendicular to the first plurality of conductive fibers;
   wherein the at least one electrical grid is embedded within one of the outer and inner fiber-reinforced polymer layers on one side of the core layer, the electrical grid further including a plurality of intermediate insulating fibers sandwiched between the first plurality of conductive fibers and the second plurality of conductive fibers;

wherein the composite structure is a sidewall of a refrigerated trailer, and further comprising a sensor coupled to at least two of a first plurality of subsets of the first plurality of conductive fibers or at least two of a second plurality of subsets of the second plurality of conductive fibers, wherein the sensor is at least one of a temperature sensor, a moisture sensor, a GPS sensor, a load sensor, and an accelerometer, the sensor configured to communicate a signal indicative of a state of the refrigerated trailer.

2. The composite structure of claim 1, wherein:
the plurality of intermediate insulating fibers form a mat;
the first plurality of conductive fibers are stitched into one side of the mat; and
the second plurality of conductive fibers are stitched into another side of the mat.

3. The composite structure of claim 1, wherein the first plurality of conductive fibers and the second plurality of conductive fibers provide structural reinforcement of the composite structure.

4. The composite structure of claim 1, wherein the plurality of intermediate insulating fibers are glass.

5. The composite structure of claim 1, wherein a polymer matrix from a corresponding one of the outer and inner fiber-reinforced polymer layers is integrated into the at least one electrical grid.

6. The composite structure of claim 1, wherein:
the first plurality of subsets is powered in an alternating manner; and
the second plurality of subsets is powered in an alternating manner.

7. The composite structure of claim 1, wherein the trailer includes a power source in electrical communication with the at least one electrical grid.

8. The composite structure of claim 7, wherein the trailer includes a control system programmed to detect a break in the at least one electrical grid.

9. The composite structure of claim 8, wherein the control system is programmed to identify a location of the break.

10. The composite structure of claim 1, wherein the sensor is a temperature sensor.

11. A laminated composite structure of a cargo body, the composite structure comprising:
a core layer;
an outer fiber-reinforced polymer layer coupled to the core layer;
an inner fiber-reinforced polymer layer coupled to the core layer; and
at least one electrical grid embedded within one or more of the outer and inner fiber-reinforced polymer layers, wherein the at least one electrical grid includes:
a first plurality of conductive fibers;
a second plurality of conductive fibers perpendicular to the first plurality of conductive fibers;
wherein the at least one electrical grid is embedded within one of the outer and inner fiber-reinforced polymer layers on one side of the core layer, the electrical grid further including a plurality of intermediate insulating fibers extending between at least one of adjacent fibers of the first plurality of conductive fibers and adjacent fibers of the second plurality of conductive fibers.

* * * * *